United States Patent [19]

Kuhn

[11] Patent Number: 5,111,144

[45] Date of Patent: May 5, 1992

[54] MAGNETIC RESONANCE TOMOGRAPHY METHOD AND MAGNETIC RESONANCE TOMOGRAPHY APPARATUS FOR PERFORMING THE METHOD

[75] Inventor: Michael Kuhn, Hamburg, Fed. Rep. of Germany

[73] Assignee: U.S. Philips Corp., New York, N.Y.

[21] Appl. No.: 612,950

[22] Filed: Nov. 13, 1990

[30] Foreign Application Priority Data

Nov. 18, 1989 [DE] Fed. Rep. of Germany ....... 3938370

[51] Int. Cl.$^5$ ............................................. G01R 33/20
[52] U.S. Cl. .................................... 324/309; 324/307
[58] Field of Search ............... 324/300, 307, 308, 309, 324/310, 311, 312, 313, 314, 318, 322; 128/653 A

[56] References Cited

U.S. PATENT DOCUMENTS

| Re. 33,279 | 7/1990 | Wehrli | 324/309 |
|---|---|---|---|
| 4,480,228 | 10/1984 | Bottomley | 324/309 |
| 4,587,489 | 5/1986 | Wehrli | 324/309 |
| 4,803,432 | 2/1989 | Perman | 324/309 |

FOREIGN PATENT DOCUMENTS 2101327 1/1983 United Kingdom .

OTHER PUBLICATIONS

P. R. Locher, "Proton NMR Tomography", Philips Technical Review, vol. 41, No. 3, 1983/84, pp. 73–88.

Primary Examiner—Michael J. Tokar
Attorney, Agent, or Firm—Jack D. Slobod

[57] ABSTRACT

The invention relates to a magnetic resonance tomography method where a plurality of sequences act on an object to be examined in the presence of a steady, uniform magnetic field, each of said sequences including the generating of a magnetic rf pulse in conjunction with a first magnetic gradient field and the reading of a spin resonance signal in the presence of a second magnetic gradient field having a gradient extending perpendicularly to the gradient of the first field, an image of the nuclear magnetization distribution being reconstructed from the spin resonance signals by Fourier transformation. In order to produce a survey image therefrom in an as short as possible period of time, the object to be examined is displaced during the examination in the direction of the gradient of the first magnetic gradient field, the image of the nuclear magnetization distribution being line-wise reconstructed by way of a one-dimensional Fourier transformation of the spin resonance signal each time obtained.

4 Claims, 2 Drawing Sheets

MAGNETIC RESONANCE TOMOGRAPHY METHOD AND MAGNETIC RESONANCE TOMOGRAPHY APPARATUS FOR PERFORMING THE METHOD

BACKGROUND OF THE INVENTION

The invention relates to a magnetic resonance tomography method where a plurality of sequences act on an object to be examined in the presence of a steady, uniform magnetic field, each of said sequences including the generating of a magnetic rf pulse in conjunction with a first magnetic gradient field and the reading of a spin resonance signal in the presence of a second magnetic gradient field which has a gradient extending perpendicularly to the gradient of the first field, the object being displaced in the direction of the gradient of the first magnetic gradient field and the image of the nuclear magnetization distribution being line-wise reconstructed by way of a one-dimensional Fourier transformation of the spin resonance signal each time obtained, and also relates to a magnetic resonance tomography apparatus for performing the method. A method and apparatus of this kind are known from DE-OS 31 24 435 which corresponds to GB-A-2 101 327.

In medical practice it is often desirable to form a survey image which is ensured to include a diagnostically relevant zone. In X-ray computer tomography such survey images are obtained in that a patient is irradiated by a fan-shaped X-ray beam while being displaced perpendicularly to the beam. The so-called scannogram thus obtained represents a projection of the X-ray absorption distribution perpendicular to the table top.

The known magnetic resonance tomography method also produces a projection image (of the nuclear magnetization distribution) of the patient, but interpretation of such an image is virtually impossible, because all soft tissues produce a very strong signal, as opposed to an X-ray scannogram in which essentially only the bones are involved in imaging.

SUMMARY OF THE INVENTION

It is an object of the invention to provide a method of the kind set forth which enables a diagnostically interpretable survey image to be formed within a comparatively short period of time and also to provide an apparatus which is suitable for performing the method.

This object is achieved in accordance with the invention in that the excitation sequences are preceded by a saturation sequence which dephases the nuclear magnetization everywhere outside a slice extending parallel to the directions of the two gradients. Thus, in accordance with the invention the nuclear magnetization is dephased everywhere outside a slice extending parallel to the displacement direction. Therefore, the image produced by the subsequent excitation sequences represents only a projection image within said slice. When the thickness of this slice is suitably chosen, a survey image can be obtained which has the nature of a readily interpretable scannogram.

If a comparatively long period of time elapses between the excitation of the first and the last slice, the dephasing of the nuclear magnetization outside the slice may already have disappeared before the last slice is reached, so that the zones situated outside the slice also contribute to the relevant spin resonance signal. In a further version in accordance with the invention this can be prevented by executing a further saturation sequence each time after several excitation sequences.

A non-previously excited slice would then pass the isocentre during a saturation sequence if the displacement were to be continued during this sequence. If the excitation sequences succeeding said further saturation sequence were identical to the previously generated excitation sequences, the zone passing the isocentre during a saturation sequence would not be imaged. This could be avoided by interrupting the displacement during each further saturation sequence. However, the object to be examined would then be exposed to acceleration and deceleration forces which could produce motion artefacts in the spin tomogram.

In order to avoid such artefacts, according to a further version of the invention the displacement of the object to be examined is not interrupted and after each further saturation sequence the frequency of the rf pulses of the excitation sequences is changed so that the slices excited thereby directly adjoin the slices excited before the saturation sequence.

An apparatus for performing the method is characterized in that it comprises a magnet for generating a uniform, steady magnetic field, a coil system for generating magnetic rf pulses, gradient coil systems for generating magnetic fields which extend in the direction of the uniform, steady magnetic field and which have gradients extending in different directions, a Fourier transformation device for performing a one-dimensional Fourier transformation of the spin resonance signals, a supporting device for the object to be examined, drive means for displacing the supporting device during an examination, and a control unit which controls the drive unit, the gradient coil systems, the rf coil system and the Fourier transformation device so that first the nuclear magnetization outside a slice containing the displacement direction is saturated and subsequently the object is displaced in the direction of a gradient in the displacement direction, the image of the nuclear magnetization being line-wise reconstructed by way of a one-dimensional Fourier transformation, of the spin resonance signal each time obtained.

BRIEF DESCRIPTION OF THE DRAWING

The invention will be described in detail hereinafter with reference to the drawing. Therein:

FIG. 1 shows a magnetic resonance tomography apparatus suitable for carrying out the invention.

DETAILED DESCRIPTION OF THE PREFERRED EMBODIMENTS

Figure 3:
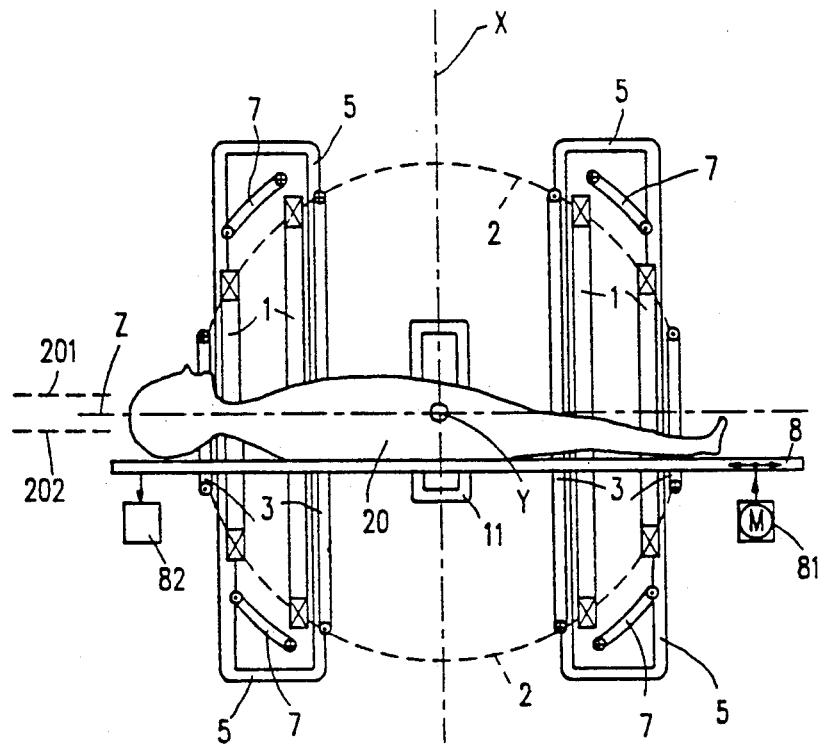
FIG. 3 shows the position in time of various signals during a saturation sequence.

The magnetic resonance tomography apparatus which is diagrammatically shown in FIG. 1 comprises a system which consists of four coils 1 and which serves to generate a uniform, steady magnetic field whose strength may amount to a fraction of Tesla but also to some Tesla. This field extends in the z-direction of a cartesian coordinate system. The coils which are concentrically situated with respect to the z-axis may be arranged on the surface 2 of a sphere whose centre forms the so-called isocentre.

The patient 20 to be examined is arranged on a table top 8 within said coils. Via a motor drive 81, the table top 8 can be displaced in the z-direction, i.e. in the longitudinal direction of the patient. A position generator 82 generates an electric signal corresponding to the instantaneous position of the table top 8. There are also provided known means (not shown) for presetting how far the patient 20 on the table top 8 is to be displaced into the magnet formed by the coils 1. These means may comprise, for example, a laser which projects, for example a cross on the patient, as well as a memory in which the table top position is stored when the laser cross reaches the correct position and the operator issues a relevant command. The position thus marked may be situated at the front or the rear edge of the survey image to be formed, but also in the centre thereof.

Four coils 3 are preferably arranged on the same spherical surface 2 in order to generate a magnetic field Gz which extends in the z-direction and which linearly varies in this direction. There are also provided four coils 7 which produce a gradient field Gx (i.e. a magnetic field whose strength linearly varies in one direction) which also extends in the z-direction but whose gradient extends in the x-direction. A gradient field Gy which extends in the z-direction and which has a gradient in the y-direction is generated by four coils 5 which may have the same shape as the coils 7 but which are arranged so as to be offset 90 with respect thereto. Only two of these four coils are shown in FIG. 1.

Because each of the three coil systems 3, 5 and 7 for generating the magnetic gradient fields Gz, Gy, Gx is symmetrically arranged with respect to the spherical surface 2, the field strength in the centre of the sphere (or the isocentre), at the same time being the origin of said cartesian x-y-z coordinate system, is determined only by the steady, uniform magnetic field of the coil system 1. Furthermore, an rf coil 11 is symmetrically arranged with respect to the plane z=0 of the coordinate system, which coil is constructed so that it generates an essentially uniform magnetic field which extends in the x-direction, i.e. perpendicularly to the direction of the steady, uniform magnetic field. During each rf pulse, the rf coil 11 receives an rf modulated current from an rf generator. Subsequent to a sequence, the rf coil 11 or a separate rf receiving coil serves to receive the spin resonance signals produced in the examination zone.

Figure 2:
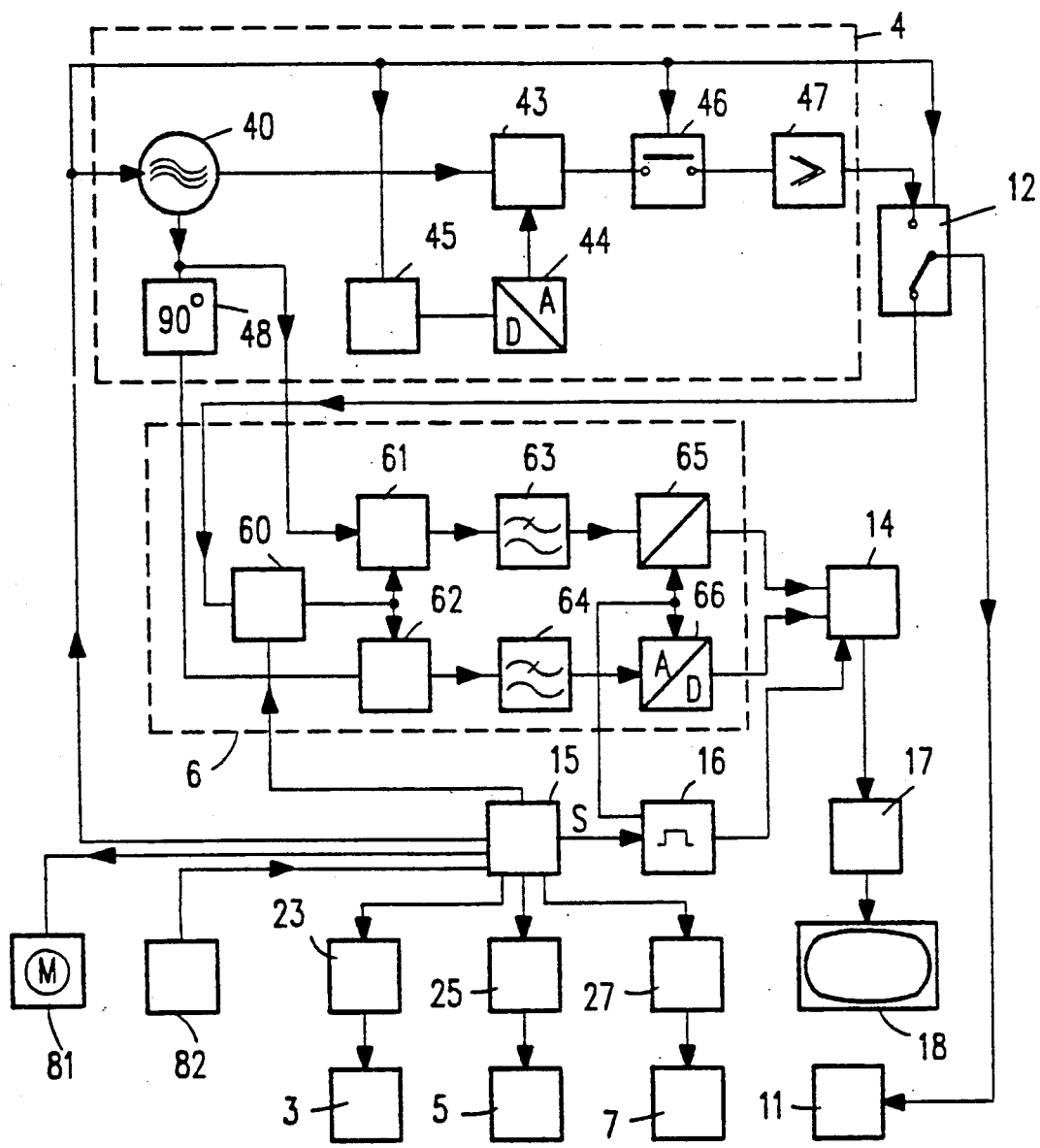
FIG. 2 shows a block diagram of such an apparatus.

FIG. 2 shows a simplified block diagram of this magnetic resonance tomography apparatus. Via a switching device 12, the rf coil 11 is connected on the one side to an rf generator 4 and on the other side to an rf receiver 6.

The rf generator 4 comprises an rf oscillator 40 whose frequency and phase can be digitally controlled by a control unit 15 and which produces oscillations of a frequency corresponding to the Larmor frequency of the nuclei to be excited at the field strength generated by the coils 1. The Larmor frequency f is calculated in known manner as f=cB, where B is the magnetic induction of the steady, uniform magnetic field and c is the gyromagnetic ratio which, for example for protons amounts to 42.56 MHz/T. The output of the oscillator 40 is connected to an input of a mixing stage 43. The mixing stage receives a second input signal from a digital-to-analog converter 44 whose output is connected to a digital memory 45. The memory stores a number of envelope signals, each as a sequence of digital data words, one of which is read for each sequence.

The mixing stage 43 processes the input signals supplied thereto so that a carrier oscillation modulated with the envelope signal appears on its output. The output signal of the mixing stage 43 is applied, via a switch 46 which is controlled by the control device 15, to an rf power amplifier 47 whose output is connected to the switching device 12. The latter device is also controlled by the control device 15.

The receiver 6 comprises an rf amplifier 60 which is connected to the switching device and which receives the spin resonance signals induced in the rf coil 11; the switching device should then occupy the appropriate position. The amplifier 60 comprises a muting input which is controlled by the control device 15 and via which it can be blocked so that the gain is substantially zero. The output of the amplifier 60 is connected to the first inputs of two multiplying mixing stages 61 and 62, each of which produces an output signal corresponding to the product of its input signals. The second inputs of the mixing stages 61 and 62 receive a signal having the frequency of the oscillator 40, a phase shift of 90° existing between the signals on the two inputs. This phase shift is produced by means of a 90 phase shifter 48 whose output is connected to the input of the mixing stage 62 and whose input is connected to the input of the mixing stage 61 and to the output of the oscillator 40.

The output signals of the mixing stages 61 and 62 are applied, via low pass filters 63 and 64 which suppress the frequency supplied by the oscillator 40 as well as all higher frequencies and which transmit lower frequency components, to a respective analog-to-digital converter 65, 66. These converters convert the analog signals of the circuit 61...64, forming a quadrature demodulator, into digital data words which are applied to a memory 14. The analog-to-digital converters 65 and 66 as well as the memory 14 receive their clock pulses from a clock pulse generator 16 which can be blocked and enabled, via a control lead, by the control unit 15, so that the signals supplied by the rf coil 11 and transposed to the low frequency range can be converted into a series of digital data words for storage in the memory 14 only during a measuring interval which is defined by the control unit 15.

Via a one-dimensional Fourier transformation, a computer 17 calculates from each spin resonance signal the nuclear magnetization distribution in a line extending perpendicularly to the z-direction. The survey image is produced from a multitude of such lines.

The control unit 15 controls the motor drive 81 and processes the signals of the position generator so that the table top 8 can be displaced to a defined position. Control unit 15 also controls current generators 23, 25 and 27 which feed magnetic gradient fields coils 3, 5, and 7, respectively.

FIG. 3 shows the position of various signals for a saturation sequence defining a given slice within the patient 20 in that it excites the nuclear magnetization throughout the examination zone and dephases it in the zones situated to either side of the defined slice.

This saturation sequence is shown in FIG. 3 and comprises two rf pulses HF2 and HF3 which are accompanied by a magnetic gradient field Gx whose gradient extends perpendicularly to the read gradient (fourth line of FIG. 4), so in this case in the x-direction (see second line).

As regards central frequency and bandwidth the rf pulse HF2 is shaped so that, in conjunction with the magnetic gradient field Gx (second line) it excites the nuclear magnetization in a zone, for example above the horizontal plane denoted by the broken line 201 in FIG. 1. The rf pulse HF3 has a central frequency such that, in conjunction with the magnetic gradient field Gx, the nuclear magnetization is excited in a zone which is situated underneath a second plane 202 (FIG. 1). A subsequently activated magnetic gradient field Gy dephases the nuclear magnetization in the zones in which it was previously excited, so that these zones do not contribute to the spin resonance signal during the subsequent excitation sequences.

Dephasing could also be realized by activation of a magnetic gradient field Gz after the rf pulse HF3, or by prolonging the gradient field Gx even further.

Instead of two rf pulses HF2 and HF3, it also suffices to generate a single rf pulse if the frequency spectrum thereof is such that it simultaneously excites on the one side the zones above the plane 201 and on the other side the zones below the plane 202. This implies that a correspondingly complex envelope must be stored in the memory 45. Such a saturation method is known per se (see DE-A 36 04 281).

Another possibility for the dephasing of the nuclear magnetization in the zones outside the slice defined by the planes 201 and 202 consists in that first a first 90° rf pulse is generated which excites the nuclear magnetization throughout the examination zone and in that subsequently a second slice-selective rf pulse (i.e. an rf pulse accompanied by a magnetic gradient field) is generated which rotates the nuclear magnetization within the slice 201-202 back in the z-direction again. The excitation still existing outside this slice is dephased again by subsequently applied magnetic gradient fields.

Subsequently, excitation sequences are generated which result in a projection of the nuclear magnetization distribution within said slice on a plane extending parallel to the z-direction.

Figure 4:
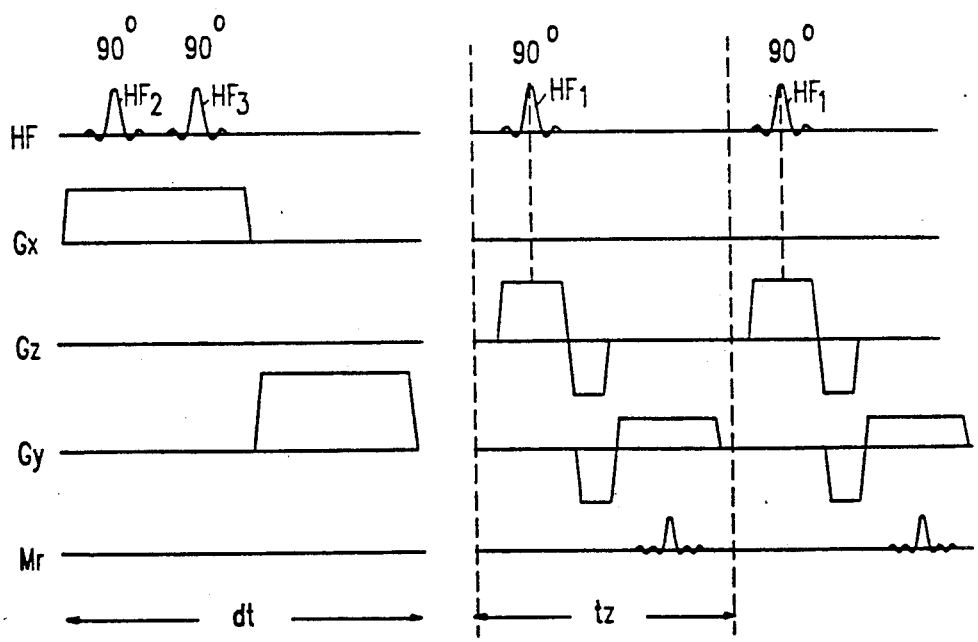
FIG. 4 shows the position in time of the corresponding signals during two successive excitation sequences.

FIG. 4 shows the position of different signals during two successive excitation sequences. During these excitation sequences, the table top 8 is displaced at a constant speed v. Each excitation sequence comprises an rf pulse HF1 (first line) which acts, in conjunction with the magnetic gradient field Gz (third line), as a slice-selective rf pulse which rotates the nuclear magnetization preferably through 90° in a slice extending perpendicularly to the z-direction (i.e. to the displacement direction of the table top 8). The central frequency of the rf pulse HF1 is preferably chosen so that the slice excited thereby is situated in the isocentre. The bandwidth of the rf pulse HF1 and the gradient Gz are preferably chosen so that the thickness of the slice corresponds to the path $v \cdot t_z$ travelled by the table top 8 when displaced at the speed v during the period $t_z$ of a sequence.

Subsequent to the rf pulse HF1, a magnetic gradient field having a gradient extending perpendicularly to the z-direction is activated, in this case the magnetic gradient field Gy (fourth line). The polarity of this field is reversed once, i.e. so that the time integral over this gradient field before the polarity reversal amounts to half the corresponding integral after the polarity reversal. After the polarity reversal and in the presence of a constant Gy, the spin resonance signal (fifth line) arising in the excited slice is read, i.e. the control device enables the clock pulse generator 16 so that the spin resonance signal converted into a series of digital data words can be subjected to a (one-dimensional) Fourier transformation.

This excitation sequence is followed by the next excitation sequence with identical parameters. This next excitation sequence excites the neighbouring slice which is then situated in the isocentre. Because successive excitation sequences do not excite the same but neighbouring slices, the distance in time between two excitation sequences, and hence the period $t_z$, may be small, for example between 10 and 20 ms. For a table top speed v of between 100 mm/s and 200 mm/s, slice thicknesses (or line widths) of between 1 mm and 4 mm are then obtained. When further excitation sequences are continuously generated without interruption of the displacement of the table top, a survey image will be obtained which represents a zone of the patient which is proportional to the slice thickness and the number of excitation sequences.

When the duration of the examination method is in the order of magnitude of the longitudinal relaxation time $T_1$, the dephased nuclear magnetization reaches its original state again during the excitation sequences occurring at the end of the examination, so that these zones will contribute to the spin resonance signal. This contribution can be precluded by inserting a saturation sequence after every $n^{th}$ excitation sequence, n being a suitably chosen integer. Because each saturation sequence has a finite duration dt during which the patient is displaced over the distance vdt in the case of continuous displacement of the table top, gaps could occur in the image. These gaps can be avoided by stopping the displacement of the table top before the start of the excitation sequence and by resuming the displacement again after the end of the saturation sequence. However, the patient could then be exposed to shocks, giving rise to motion artefacts in the nuclear spin tomogram.

Another possibility in this respect consists in that the table top is continuously displaced also during the saturation sequences and in that the central frequency of the rf pulse HF1 is shifted during the subsequent excitation sequences so that instead of the slice in the isocentre a slice is excited which is situated a distance vdt from the isocentre. The slices are then excited in a gap-less succession within a given zone of the patient.

A method has been described in which the selected slice (201–202) extends parallel to the plane of the table. However, it is alternatively possible to select a slice which extends parallel to the z-direction if during the rf pulse pulses HF2 and HF3 a magnetic gradient field is activated whose gradient extends perpendicularly to the z-direction and at an angle other than 0° and 180° (with respect to the horizontal). The read gradient (fourth line of FIG. 4) should then extend perpendicularly to this gradient as well as to the z-direction.

I claim:

1. A magnetic resonance tomography method where a plurality of sequences act on an object to be examined (20) in the presence of a steady, uniform magnetic field, each of said sequences including the generating of a magnetic rf pulse (HF1) in conjunction with a first magnetic gradient field (Gz) and the reading of a spin resonance signal in the presence of a second magnetic gradient field which has a gradient (Gy) extending perpendicularly to the gradient of the first field, the object being displaced in the direction of the gradient (Gz) of the first magnetic gradient field and the image of the nuclear magnetization distribution being line-wise reconstructed by way of a one-dimensional Fourier transformation of the spin resonance signal each time obtained, characterized in that the excitation sequences are preceded by a saturation sequence which dephases the nuclear magnetization everywhere outside a slice (201, 202) extending parallel to the directions of the two gradients.

2. A magnetic resonance tomography method as claimed in claim 1, characterized in that a further saturation sequence is executed each time after several excitation sequences.

3. A magnetic resonance tomography method as claimed in claim 2, characterized in that the displacement of the object to be examined is not interrupted and after each further saturation sequence the frequency of the rf pulse (HF1) of the excitation sequences is changed so that the slices excited thereby directly adjoin the slices excited before the saturation sequence.

4. An apparatus for performing the method claimed in claim 1, characterized in that it comprises a magnet (1) for generating a steady, uniform magnetic field, a coil system (11) for generating magnetic rf pulses, gradient coil systems (3, 5, 7) for generating magnetic fields which extend in the direction of the uniform, steady magnetic field and which have gradients extending in different directions, a Fourier transformation device (17) for performing a one-dimensional Fourier transformation of the spin resonance signals, a supporting device (8) for the object 20 to be examined, drive means (81) for displacing the supporting device during an examination, and a control unit (15) which controls the drive unit (81), the gradient coil systems (3, 5, 7), the rf coil system (11) and the Fourier transformation device (17) so that first the nuclear magnetization outside a slice (201, 202) containing the displacement direction is saturated and subsequently the object is displaced in the direction of a gradient (Gz) in the displacement direction, the image of the nuclear magnetization distribution being line-wise reconstructed by way of a one-dimensional Fourier transformation of the spin resonance signal each time obtained.

* * * * *